(12) United States Patent　　　　(10) Patent No.:　US 12,683,553 B2
Paul　　　　　　　　　　　　　　　　　(45) Date of Patent: 　　*Jul. 14, 2026

(54) REDUCING STARTUP TIME IN A CRYSTAL OSCILLATOR

(71) Applicant: Texas Instruments Incorporated, Dallas, TX (US)

(72) Inventor: Animesh Paul, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/784,038

(22) Filed: Jul. 25, 2024

(65) Prior Publication Data

US 2024/0388253 A1　　Nov. 21, 2024

Related U.S. Application Data

(63) Continuation of application No. 18/072,682, filed on Nov. 30, 2022, now Pat. No. 12,074,569.

(51) Int. Cl.
*H03B 5/36*　　　　(2006.01)
*H03B 5/06*　　　　(2006.01)

(52) U.S. Cl.
CPC ................. *H03B 5/36* (2013.01); *H03B 5/06* (2013.01); *H03B 5/362* (2013.01); *H03B 5/364* (2013.01)

(58) Field of Classification Search
CPC . H03B 5/36; H03B 5/06; H03B 5/362; H03B 5/364
USPC .................................... 331/158, 116 FE, 183
See application file for complete search history.

(56) References Cited

U.S. PATENT DOCUMENTS 8,378,755 B2　　2/2013　Nakamoto
12,074,569 B2 *　8/2024　Paul ......................... H03B 5/36

* cited by examiner

*Primary Examiner* — Arnold M Kinkead
(74) *Attorney, Agent, or Firm* — Michelle F. Murray; Frank D. Cimino

(57)　　　　　　　ABSTRACT

An oscillator apparatus, including a first node adapted to be coupled to a first terminal of a crystal oscillator; a second node adapted to be coupled to a second terminal of the crystal oscillator; a transconductance circuit; a first switch coupled between the first node and the second node; and a second switch coupled between the transconductance circuit and the second node.

23 Claims, 5 Drawing Sheets

400

402 — POWER ON; SWITCHES OPEN; CHARGE FIRST CAPACITOR; ENABLE TRANSCONDUCTANCE CIRCUIT

404 — CONNECT OSCILLATOR TERMINALS, FOR EXAMPLE BY CLOSING FIRST SWITCH; CHARGE SECOND CAPACITOR = FIRST CAPACITOR

406 — OPEN FIRST SWITCH

408 — CONNECT ONE OSCILLATOR TERMINAL TO LESSER VOLTAGE, FOR EXAMPLE BY CLOSINGSECOND SWITCH TO ENABLING NODE OF TRANSCONDUCTANCE CIRCUIT

REDUCING STARTUP TIME IN A CRYSTAL OSCILLATOR

CROSS-REFERENCE TO RELATED APPLICATIONS

This application is a continuation of U.S. patent application Ser. No. 18/072,682, filed Nov. 30, 2022, which application is hereby incorporated herein by reference.

BACKGROUND

An oscillator is a circuit that produces an AC clock signal, and one category of oscillators uses the resonant response from a piezoelectric element, sometimes referred to as a crystal, to produce the AC clock signal. Devices in this oscillator category are sometimes referred to as crystal oscillators, while in fact the crystal oscillator is typically a component, often external from circuitry, of the overall device. There are many crystal oscillator design considerations, and one such consideration is the startup time for the oscillator. Startup time is primarily constrained by the time to build the oscillation to a resonant frequency, after which it can be relied upon to provide a stable AC clock signal. Existing approaches may add size, complexity, cost, and potential damage to the external crystal oscillator.

Examples are provided in this document that may improve on various of the above considerations as well as other concepts, as further detailed below.

SUMMARY

In one example, there is an oscillator apparatus, including a first node adapted to be coupled to a first terminal of a crystal oscillator; a second node adapted to be coupled to a second terminal of the crystal oscillator; a transconductance circuit; a first switch coupled between the first node and the second node; and a second switch coupled between the transconductance circuit and the second node.

Other aspects are also disclosed and claimed.

DETAILED DESCRIPTION

Figure 1:
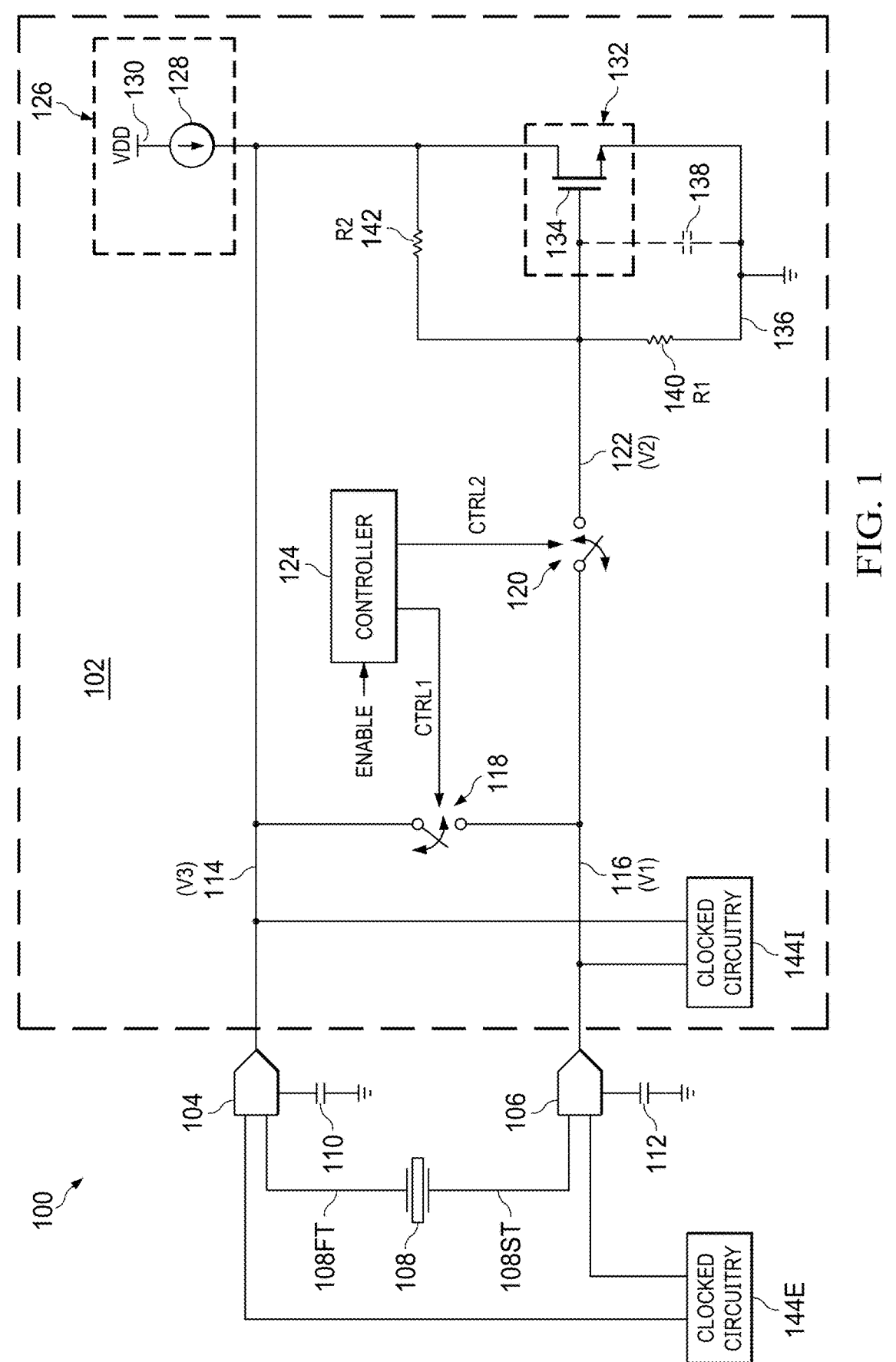
FIG. 1 is an electrical diagram of an oscillator configuration.

FIG. 1 is an electrical diagram of an oscillator configuration 100. The oscillator configuration 100 includes circuitry, as may be formed, for example, as an integrated circuit (IC) 102, that includes a first pad 104 and a second pad 106. The first pad 104 and second pad 106 may be nodes, contacts, or other electrical points to which another electrical device may be connected. The oscillator configuration 100 also includes a crystal (piezoelectric) oscillator 108, which in the example is external from the IC 102. The crystal oscillator 108 has a first terminal 108FT connected to the first pad 104 and a second terminal 108ST connected to the second pad 106. The crystal oscillator 108 has inherent attributes that may be modeled as inductance and capacitance, and from which it may be driven to oscillate at a resonant frequency. The resulting resonant frequency is used as a stable and accurate AC clocking signal. Further, the oscillator configuration 100 typically includes a first capacitor 110 connected from the first pad 104 to a relatively low potential, such as ground, and a second capacitor 112 connected from the second pad 106 to the low potential (ground). The first and second capacitors 110 and 112 also may be external from the IC 102, and are typically provided at capacitive values to impact the target operating frequency of the oscillator configuration 100. The crystal oscillator 108 also has an inherent or modeled resistance that, without additional compensation, will dampen the oscillations over time. Detailed below, the IC 102 includes various circuitry to facilitate a desirable and relatively fast startup, and maintenance, of the resonant oscillation, and corresponding and AC clocking signal, of the crystal oscillator 108.

Within the IC 102, the first pad 104 is coupled to a first node 114, and the second pad 106 is coupled to a second node 116. A first switch 118 is coupled between the first node 114 and the second node 116. A second switch 120 is coupled between the second node 116 and a third node 122. Each of the first switch 118 and the second switch 120 may be implemented using various technologies, for example with a transistor or transistor passgate. Each of the first switch 118 and the second switch 120 is controlled to open and close in response to a state from a respective control signal CTLR1 and CTRL2. The control signals CTLR1 and CTRL2 are provided from a controller 124. The controller 124 may initialize a startup sequence as detailed below, for example in response to either an internal or external ENABLE signal, which may be asserted to commence the startup at a time when it is desired to start up the oscillator configuration 100. A bias circuit 126 is connected to the first node 114. The bias circuit 126 may include, for example, a current source 128 connected between a voltage supply terminal 130, biased for example by an internal voltage supply VDD, and the first node 114. While not shown, the bias circuit 126 may include additional selectable paths to adjust the amount of bias current. Also, for example, assume that VDD=1.35 V, and of that voltage, 850 mV is headroom across the current source 128, leaving 500 mV on its other end (at the first node 114). The first node 114 is connected to a negative transconductance circuit 132, which is an active circuit included to provide energy to offset the loss from parasitic resistance of the crystal oscillator 108, that is, to countereffect that parasitic attribute so that oscillations of the crystal oscillator 108 will not decline over time. In the example, the negative transconductance circuit 132 includes a transistor 134, for example a negative-channel metal oxide semiconductor (NMOS) transistor. While not shown, the negative transconductance circuit 132 may include additional amplitude control circuitry to adjust the negative transconductance of the transistor 134, and configurations other than the NMOS transistor (with a gate-to-drain resistor) may be implemented. The gate of the transistor 134 is connected to the third node 122. The drain of the transistor 134 is connected to the first node 114, and the source of the transistor 134 is connected to a fourth node 136. The transistor 134 also has a parasitic gate capacitance 138, which is shown in dashed lines due to its parasitic existence and is separately described for reasons detailed later. The parasitic gate capacitance 138 is coupled between the gate of the transistor 134 and the fourth node 136. A first resistor 140 is connected between the third node 122 and the fourth node 136. The fourth node 136 is connected to ground. A second resistor 142 is connected between the first node 114 and the third node 122. The first resistor 140 has a larger resistance R1 than a resistance R2 of the second resistor 142. For example, the ratio R1:R2 can be from 3:1 to 4:1, so that as voltage is divided among the series connection of the first resistor 140 and the second resistor 142, a larger amount of voltage will appear across the first resistor 140, and where these resistances are selected so that the voltage across the first resistor 140 is sufficient to enable the gate of the transistor 134. Additionally, the inclusion of the first and second resistors 140 and 142 ensures a different voltage V3 at the first node 114 from the voltage V2 at the first node 140, for reasons described later. Lastly and by way of example, the IC 102 may include either or both of internal clocked circuitry 144I and external clocked circuitry 144E, either or both of which may be clocked by the resonant frequency of the crystal oscillator 108, once that oscillator has been properly started up and reached a steady resonant state. The internal and external clocked circuitry 144I and 144E can be one or more of various types of devices/blocks/cores that require accurate and/or high-frequency clock signals to operate.

Figure 2:
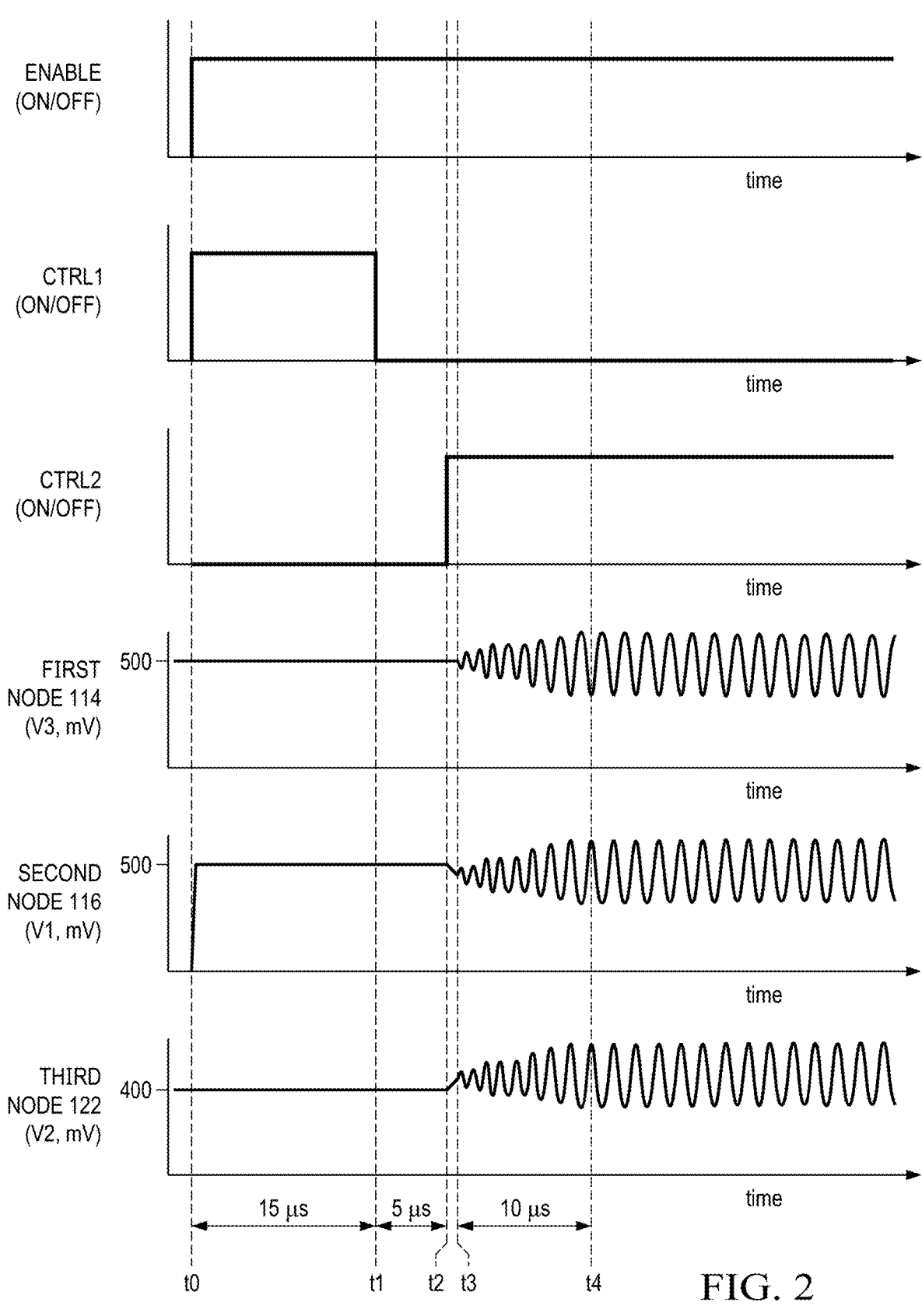
FIG. 2 is a timing diagram of various operations stages of the FIG. 1 oscillator configuration.
Figure 3A:
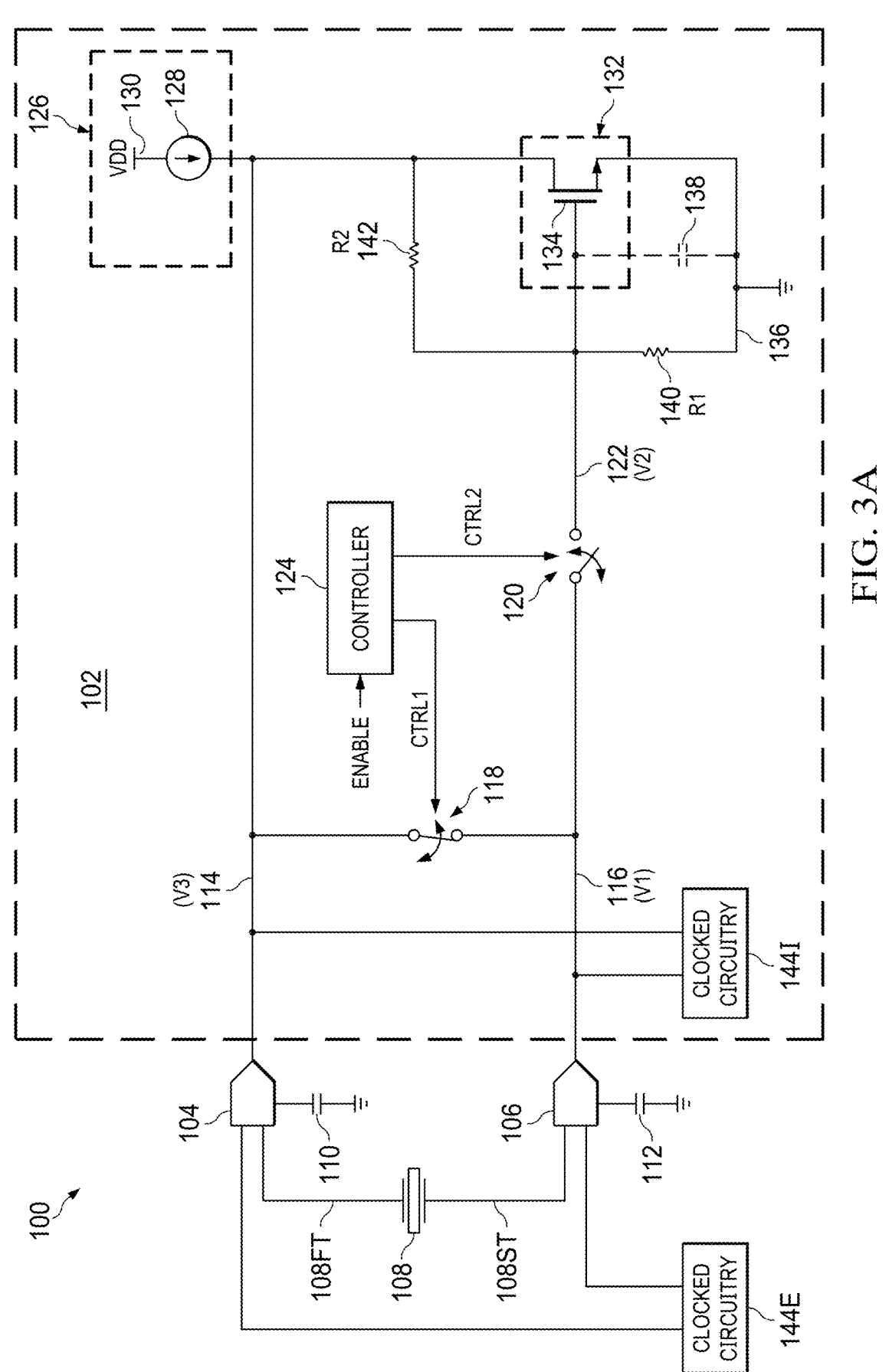
FIGS. 3A and 3B illustrates the FIG. 1 configuration in alternative switched configurations.
Figure 3B:
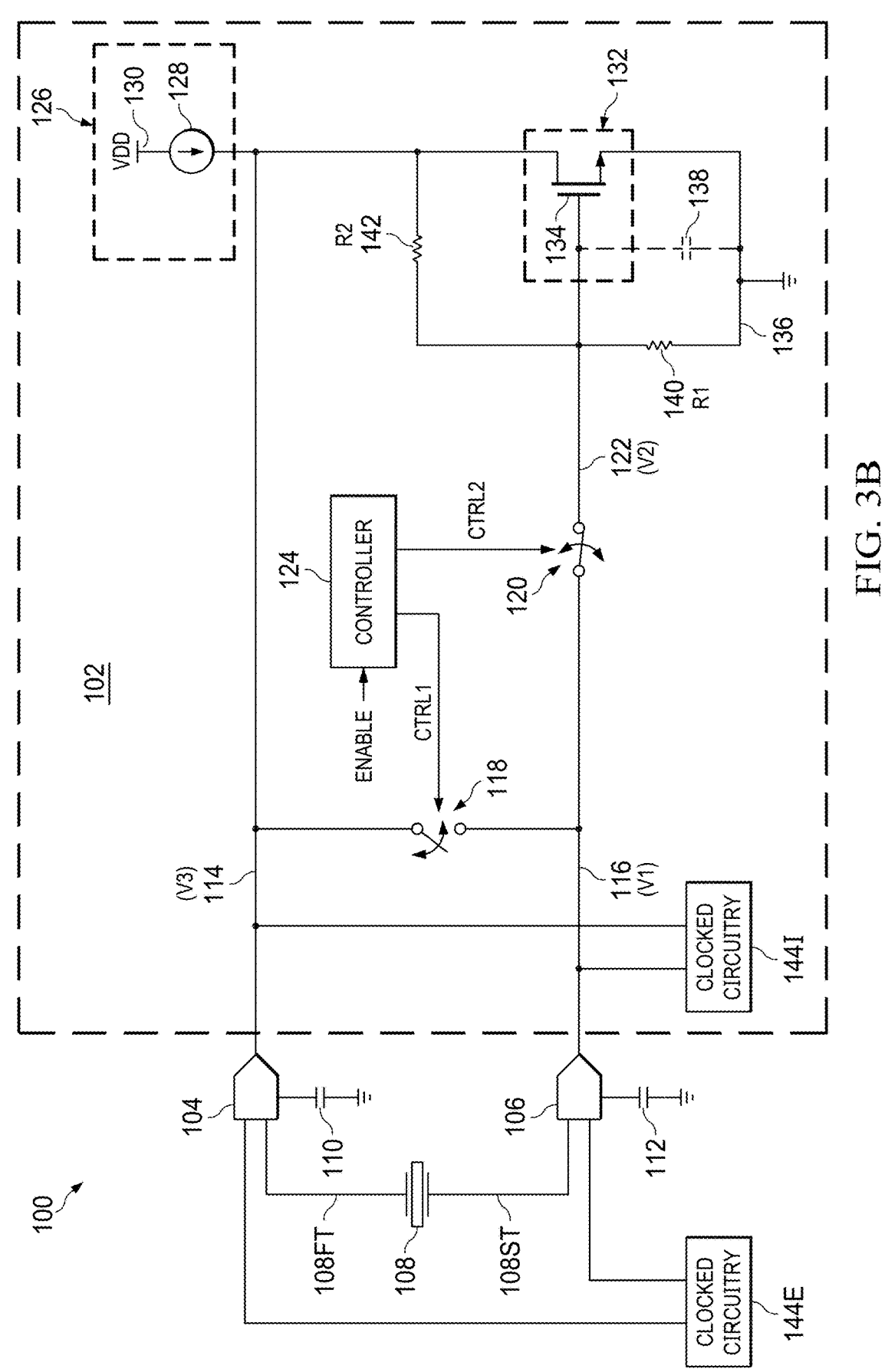

FIG. 2 is a timing diagram of various operations stages of the FIG. 1 oscillator configuration 100, and correspondingly FIGS. 3A and 3B illustrate alternative switched configurations corresponding to some of those stages. The top three rows in FIG. 2 illustrate control signals, namely, the ENABLE to the controller 124, and the CTRL1 and CTRL2 signals from the controller 124 to the first and second switches 118 and 120, respectively. By example, each of these signals is considered active high, that is, asserted to an on state as a high signal and de-asserted to an off state as a low signal. The lower three rows in FIG. 2 illustrate voltage levels at the respectively indicated nodes, namely, V3 at the first node 114, V1 at the second node 116, and V2 at the third node 122.

In FIG. 2, prior to a time t0, both the first switch 118 and the second switch 120 are open, as shown in FIG. 1. Accordingly, the bias circuit 126 provides a voltage to the first node 114, and a current to, and a voltage across, the series-connected first and second resistors 140 and 142. With the earlier-stated example that the voltage after the current source 128 of the bias circuit 126 is 500 mV, then prior to t0, V3=500 mV, which is also stored across the first capacitor 110. Further, this 500 mV voltage divides across the series combination of the first and second resistors 140 and 142, and because the first resistor 140 has a relatively larger resistance R1 as compared to the resistance R2 of the second resistor 142, then a majority of the 500 mV appears across the first resistor 140 and as V2 at the third node 122; for example, if R1:R2=4:1, then V2=400 mV (with 100 mV across the second resistor 142). Also during this time, the voltage at the second node 116 is V1=0 V.

FIG. 2 also illustrates that at t0, the ENABLE signal is asserted, and remains asserted, to the controller 124, as may occur based on an event either internal or external relative to the IC 102 (e.g., a reset, startup, or other oscillator startup event). In response, the controller 124 asserts the control signal CTRL1, which closes the first switch 118 as shown in FIG. 3A. The closed first switch 118 connects together the first node 114 and the second node 116, thereby connecting the voltage V3=500 mV to the second node 116 and correspondingly charging the second capacitor 112. Accordingly, at t0, FIG. 2 depicts a rising transition from V2=0V to V2=500 mV. The rising rate depends primarily on the capacitance values of the first and second capacitors 110 and 112, but will be relatively fast (e.g., one or two orders, such as a few nanoseconds) compared to other durations (shown in microseconds, μs) shown in FIG. 2. For ease of reference and perception, the signal transitions are shown slightly slower in FIG. 2 and are therefore not necessarily to time scale.

FIG. 2 also illustrates a signal transition at t1, which follows after a duration, for example of 15 μs, after t0. At t1, the controller 124 de-asserts the control signal CTRL1. In response, the first switch 118 opens, and with the second switch 120 already open, the switch state thereby returns to that shown in FIG. 1. This state of both open switches is maintained for a period, for example of 5 μs, after t1 and until t2. Accordingly, the time from t1 and until t2 avoids any chance of both switches 118 and 120 being closed, and providing concurrent conductive paths, at the same time. Meanwhile, between t1 and t2, the respective voltage at each of the first node 114, the second node 116, and the third node 122 remains constant.

FIG. 2 further illustrates that at t2, the controller 124 asserts the control signal CTRL2, which closes the second switch 120 as shown in FIG. 3B. The closed second switch 120 connects together the second node 116 and the third node 122. Immediately prior to this t2 event, the second and third nodes 116 and 122 have differing voltages of V1=500 mV and V2=400 mV, respectively. Following t2, the voltages at those nodes transition toward one another, again at a rate based on the capacitance values of the first and second capacitors 110 and 112, and with the rate shown more slowly in FIG. 2 for example purposes. Notably, the voltage transition causes V1 at the second node 116 to decrease and V2 at the third node 122 to increase. Each of these transitions is discussed below.

The voltage V2 increasing at the third node 122 after t2 maintains an already-enabling gate-to-source voltage across the transistor 134. Particularly, the transistor 134, in combination with the second resistor 142 and the current source 128, are connected in a self-biased manner, so that immediately prior to t2, the V2=400 mV is sufficient to enable the transistor 134 and also charges the parasitic gate capacitance 138. At t2 when the second switch 120 closes, the V2 voltage further increases, continuing to enable the transistor 134, and the closed second switch 120 also connects the gate of the transistor 134, through the second node 116, to the second terminal 108ST of the crystal oscillator 108. Accordingly, at this point the transistor 134 is already enabled, and its drain and gate are respectively connected across the crystal oscillator 108, thereby providing a negative resistance that offsets the inherent resistance of the crystal oscillator 108 toward keeping it in a resonant state. Hence, the preceding period of oscillator excitation, prior to t2, does not undesirably interfere with the subsequent connection of negative resistance that maintains the oscillating signal.

The voltage V1 decreasing at the second node 116 after t2 creates a differential voltage between V1 at the second node 116 and V3 at the first node 114. This differential voltage creates an excitation across the crystal oscillator 108, as its two terminals 108FT and 108ST (connected respectively to the first and second nodes 114 and 116) are, for a period following t2, biased at different voltage levels by the respective, and differing, voltages at the first node 114 and the second node 116. This excitation stimulates the crystal oscillator 108 to begin to oscillate. Accordingly, after t2, a brief period of signal transition, from t2 to t3, is illustrated at these nodes, whereby the voltage V1 at the second node 116 decreases, while the voltage V2 at the third node 122 increases.

Next, at t3, the voltage at both of the second and third nodes 116 and 122, and also at the first node 114, begin to oscillate. Each oscillating signal starts with a low amplitude voltage swing that continues to increase, generally centered at the DC voltage appearing at the respective node when the oscillation commences. For example, at the first node 114, the oscillating signal is centered about 500 mV, and at the second and third nodes 116 and 122, the signal is centered about approximately 450 mV. The increasing V3 oscillation signal at the first node 114 is in a first phase, and the increasing respective V1 and V2 signals at the second and third nodes 116 and 122 are in a second phase, opposite that of the first phase.

By t4, each oscillating voltage at each of the first node 114, the second node 116, and the third node 122, reaches a respective level that is sufficiently large that can be resolved into an oscillating signal that swings from rail to rail signal (the supply VDD to ground). Accordingly, at this point (at least by t4), the startup period for the oscillator configuration 100 is complete. Further, the time from t0 to t4 demonstrates an oscillator startup time of approximately 30 μs. Within the circuitry illustrated, the oscillating signal may not fully swing from rail to rail, as it may be limited by the nonlinear behavior of the transistor 134, for example due to its different operations regions (saturation, linear, and cut off). However, as of t4, the less than rail-to-rail oscillating signa(s) is of sufficient amplitude and steadiness to be coupled to an additional stage (e.g., high gain amplifier) to increase/amplify it to a full rail to rail clock signal.

Figure 4:
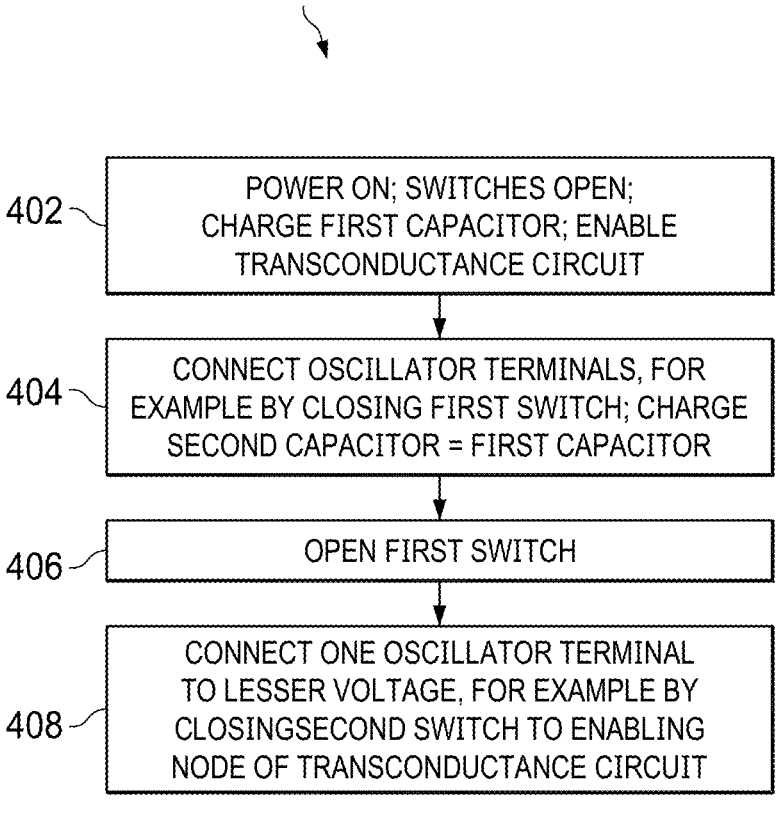
FIG. 4 illustrates a method of operation of the FIG. 1 oscillator configuration.

FIG. 4 illustrates a method 400 of operation of the FIG. 1 oscillator configuration 100.

A step 402 represents power (e.g., VDD) first applied to the oscillator configuration 100 while the first and second switches 118 and 120 are open. Accordingly, the negative transconductance circuit 132 is enabled during the step 402, and a capacitor connected to one of the crystal oscillator terminals (e.g., the first capacitor 110, connected to the first terminal 108FT) charges a corresponding node voltage V3, to a first level, for example V3=500 mV.

In a next step 404, the crystal oscillator terminals 108FT and 108ST are connected to each other. This connection causes the a capacitor connected to the other of the crystal oscillator terminals (e.g., the second capacitor 110, connected to the second terminal 108ST) to also charge, as in step 402, to a corresponding node voltage V1, at the first level, again for example V1=500 mV. The step 404 is maintained for a first time period TP1, sufficiently adequate to ensure that V3=V1 (e.g., 15 μs).

In a next step 406, the step 404 connection is opened. Accordingly, the first switch 118 may be opened, while the second switch 120 is already open. Both switches remain open for a period, for example of 5 μs, avoiding any chance the both switches 118 and 120 can be closed, and provide concurrent conductive paths, at the same time.

In a next step 408, one of the crystal oscillator terminals is connected to a node that also enables the negative transconductance circuit 132. The step 408 connection creates a voltage differential excitation across the crystal oscillator 108, while also keeping the negative transconductance circuit 132 enabled. Accordingly, the crystal oscillator 108 startup is complete, and thereafter the crystal oscillator 108 builds to an ongoing steady-state output oscillation, which continues to be augmented by the enabled transconductance circuit 132. Thereafter, the oscillator configuration 100 can continue to produce a steady, accurate clock signal, for example to the clocked circuitry 144I and 144E.

The described examples provide an oscillator configuration 100, for example with a crystal oscillator 108. A switched architecture provides numerous advantages. As one example advantage, the switching period and subsequent oscillator startup can be completed relatively quickly, for example in a period of 30 μs as shown in FIG. 2. As another example advantage, the crystal oscillator 108 is stimulated with a differential excitation voltage below a full rail-to-rail voltage, that is, less than that between VDD (e.g., VDD=1.35 V) and ground, where for example the excitation signal is between V3 and V1, as V1 declines following t2. In the illustrated example with VDD=1.35 V, only a portion of that voltage, for example V3=500 mV is applied to the circuitry of the oscillator configuration 100, below the bias circuit 126. Further, of that 500 mV, in the transition between t2 and t3, a differential voltage of approximately 50 mV is created between the second node 116 and the third node 122, that is, where the differential is 10% of the 500 mV, or approximately 3.7% of the entire VDD. Accordingly, the oscillations are commenced with a differential voltage, across the crystal oscillator terminals 108FT and 108ST, of less than 50% of the VDD and, in the example given, less than 5% of the VDD. With this relatively low excitation voltage, there is reduced concern for possible negative impact by exciting the crystal oscillator 108 in this way, as compared to a possible rail-to-rail excitation which might damage or degrade performance of the crystal structure, for example over time. As another example, the configuration may be operated to enable its negative resistance prior to, or concurrently with, the crystal oscillator excitation, so that once the oscillation startup is complete, the negative resistance is readily available to support ongoing oscillation of the crystal oscillator. As still another example, the crystal oscillator excitation can occur without the drawbacks of other architectures, for example, in a smaller design, and also for example without a separate, area consuming and complexity increasing, frequency-injecting proximity-based oscillator, or without large onboard switchable capacitors that consume large areas and increase device cost, or without a large rail-to-rail voltage impulse to the crystal oscillator, also potentially combined with a disrupted negative resistance circuit. Other benefits include variations and modifications to the structure, consistent with the teachings of this document. Accordingly, additional modifications are possible in the described embodiments, and other examples are possible, within the scope of the following claims.

What is claimed is:

1. An electronic circuit comprising:
   first and second input terminals;
   an intermediate node coupled between the first and second input terminals; and
   a controller configured to:
      at a first time, couple the first and second input terminals to cause a first voltage at the first input terminal to propagate to the second input terminal, and
      at a second time after the first time, couple the intermediate node to the second input terminal to cause a voltage drop at the second input terminal while maintaining the first voltage at the first input terminal, wherein the intermediate node has a second voltage at the second time, and wherein a difference between the first voltage and the second voltage is less than a rail-to-rail voltage.

2. The electronic circuit of claim 1, further comprising a first switch coupled between the first and second input terminals, wherein, to couple the first and second input terminals, the controller is configured to close the first switch.

3. The electronic circuit of claim 2, further comprising a second switch coupled between the second input terminal and the intermediate node, wherein, to couple the intermediate node to the second input terminal, the controller is configured to close the second switch.

4. The electronic circuit of claim 3, wherein the controller is configured to open the first switch before closing the second switch.

5. The electronic circuit of claim 1, further comprising a first transistor having a control terminal coupled to the intermediate node, a first current path terminal coupled to the first input terminal, and a second current path terminal coupled to the intermediate node.

6. The electronic circuit of claim 5, further comprising:
   a first resistor coupled between the control terminal of the first transistor and the first current path terminal of the first transistor; and
   a second resistor coupled between the control terminal of the first transistor and the second current path terminal of the first transistor.

7. The electronic circuit of claim 6, wherein a first resistance of the first resistor is lower than a second resistance of the second resistor.

8. The electronic circuit of claim 7, wherein the second resistance is between 3 and 4 times larger than the first resistance.

9. The electronic circuit of claim 1, wherein the controller is configured to couple the first and second input terminals at the first time responsive to an enable signal.

10. The electronic circuit of claim 9, wherein the controller is configured to receive the enable signal.

11. The electronic circuit of claim 1, further comprising a first circuit coupled to the first and second input terminals, the first circuit configured to be clocked by an oscillating signal at a third time after the second time.

12. The electronic circuit of claim 1, further comprising a resonant element coupled between the first and second input terminals.

13. The electronic circuit of claim 1, wherein the electronic circuit is configured to cause an oscillating signal to be developed at the first input terminal at a third time after the second time, and for the oscillating signal to increase in peak-to-peak magnitude until reaching steady state at a fourth time occurring after the third time.

14. The electronic circuit of claim 13, wherein the controller is configured to decouple the first and second input terminals at a fifth time after the first time and before the second time.

15. The electronic circuit of claim 14, wherein a first period of time between the first and fifth time is longer than a second period of time between third time and the fourth time.

16. The electronic circuit of claim 1, wherein the electronic circuit is implemented as an integrated circuit.

17. An electronic circuit comprising:
   a first switch having a first terminal and a second terminal;
   a transistor having a control terminal, a first current path terminal coupled to the first terminal of the first switch, and second current path terminal;
   a second switch having a first terminal and a second terminal, the first terminal coupled to the second terminal of the first switch and the second terminal coupled to the control terminal of the transistor;
   a first resistor coupled between the control terminal of the transistor and the first current path terminal of the transistor; and
   a second resistor coupled between the control terminal of the transistor and the second current path terminal of the transistor.

18. The electronic circuit of claim 17, wherein a first resistance of the first resistor is lower than a second resistance of the second resistor.

19. The electronic circuit of claim 18, wherein the second resistance is between 3 and 4 times larger than the first resistance.

20. The electronic circuit of claim 17, further comprising a controller configured to:
   at a first time, close the first switch:
   at a second time after the first time, open the first switch; and
   at a third time after the second time, close the second switch.

21. The electronic circuit of claim 17, further comprising a resonant element coupled between the the the first terminal of the first switch and the second terminal of the second switch.

22. A system comprising:
   an oscillator having a first terminal and a second terminal;
   a first switch having a first terminal and a second terminal, the first terminal coupled to the first terminal of the oscillator and the second terminal coupled to the second terminal of the oscillator;
   a transistor having a control terminal, a first current path terminal coupled to the first terminal of the first switch, and second current path terminal;
   a second switch having a first terminal and a second terminal, the first terminal coupled to the second terminal of the first switch and the second terminal coupled to the control terminal of the transistor;
   a first resistor coupled between the control terminal of the transistor and the first current path terminal of the transistor; and
   a second resistor coupled between the control terminal of the transistor and the second current path terminal of the transistor.

23. The system of claim 22, wherein the oscillator is a crystal oscillator.

* * * * *